United States Patent [19]
Chen et al.

[11] Patent Number: 5,837,058
[45] Date of Patent: Nov. 17, 1998

[54] HIGH TEMPERATURE SUSCEPTOR

[75] Inventors: Steven Aihua Chen, Fremont; Ming Xi, Santa Clara; Ruiping Wang, Fremont, all of Calif.

[73] Assignee: Applied Materials, Inc., Santa Clara, Calif.

[21] Appl. No.: 680,328

[22] Filed: Jul. 12, 1996

[51] Int. Cl.$^6$ .................................................. C23C 16/00
[52] U.S. Cl. ............................. 118/728; 118/725; 118/500
[58] Field of Search ..................................... 118/725, 728, 118/729, 730, 500; 219/634, 638, 730, 86.25

[56] References Cited

U.S. PATENT DOCUMENTS

| | | | |
|---|---|---|---|
| 3,436,255 | 4/1969 | Harris et al. .............................. | 117/88 |
| 4,710,428 | 12/1987 | Tamamizu et al. ...................... | 428/408 |
| 4,978,567 | 12/1990 | Miller ....................................... | 428/157 |
| 5,033,407 | 7/1991 | Mizuno et al. .......................... | 118/725 |
| 5,226,383 | 7/1993 | Bhat ........................................ | 118/730 |
| 5,288,327 | 2/1994 | Bhat ........................................ | 118/719 |
| 5,345,999 | 9/1994 | Hosokawa ............................... | 165/80.2 |
| 5,350,427 | 9/1994 | Freytsis et al. ......................... | 29/25.01 |
| 5,584,971 | 12/1996 | Komino ............................... | 204/192.13 |
| 5,695,561 | 12/1997 | Tomiyama et al. ..................... | 118/620 |
| 5,695,568 | 12/1997 | Sinha et al. ............................. | 118/729 |
| 5,697,427 | 12/1997 | Ngan et al. ............................. | 165/80.1 |
| 5,700,725 | 12/1997 | Hower et al. ........................... | 437/225 |

*Primary Examiner*—R. Bruce Breneman
*Assistant Examiner*—Jeffrie R. Lund
*Attorney, Agent, or Firm*—Thomason and Moser

[57] ABSTRACT

A susceptor with improved resistance to thermal cycling and chemical attack between processing and cleaning cycles. The susceptor comprises a top surface is surrounded by a lip, the lip having a beveled inner side, a top side, an outer side, a first rounded edge between the top side and the outer side, a second rounded edge between the top side and the inner side, and a third rounded edge between the inner side and the top surface. The susceptor comprises a body of graphite covered by a coating of aluminum nitride.

22 Claims, 3 Drawing Sheets

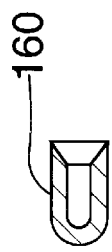 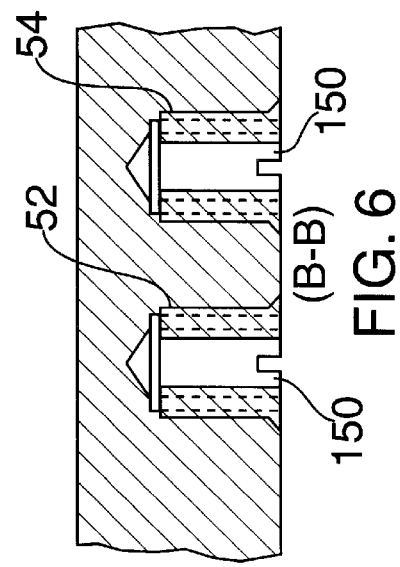 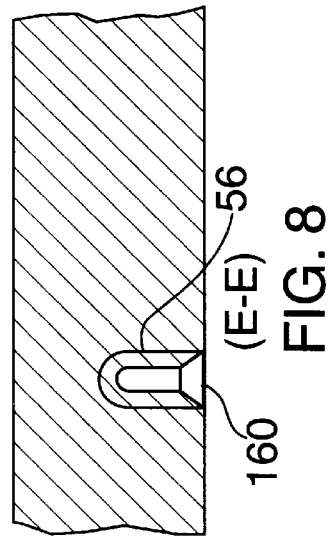 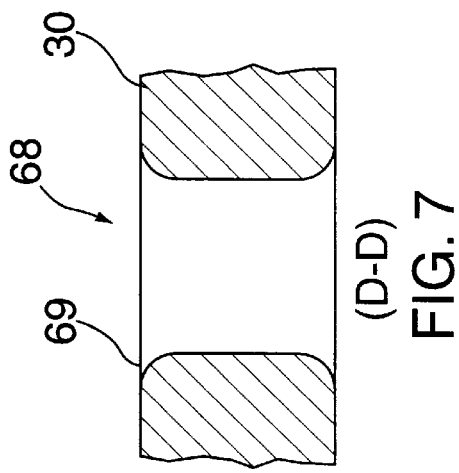 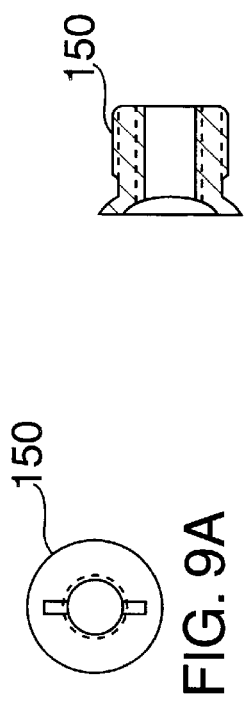 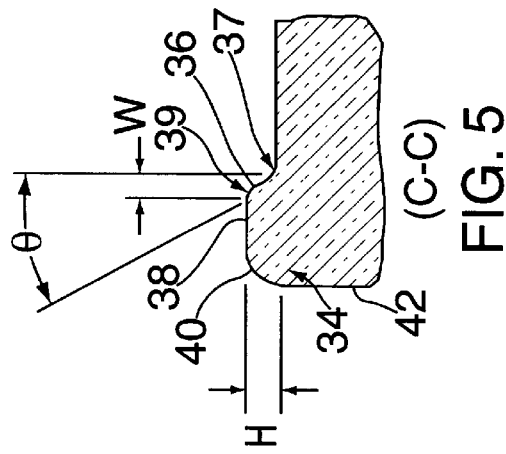

HIGH TEMPERATURE SUSCEPTOR

BACKGROUND OF THE INVENTION

1. Field of the Invention

The invention relates to chemical vapor deposition.

2. Description of the Related Art

Chemical vapor deposition (CVD) is a popular process for depositing various types of films on substrates and is used extensively in the manufacture of semiconductor integrated circuits. In CVD processing, chemicals containing atoms required in the final film are mixed and reacted in a deposition chamber. The elements or molecules deposit on the substrate surface and build up to form a film. The substrate upon which the film is to be deposited is usually mounted on a susceptor which, depending on the type of CVD process, can be comprised of a variety of materials. A susceptor preferably will have good thermal conductivity and a high resistance to thermal deformation. Aluminum, for example, is a popular susceptor material with good thermal conductivity, but which is too fragile to withstand high temperatures. Hence, susceptors made of glass carbon or graphite coated with aluminum nitride (AlN) have become popular.

There are two types of heating schemes used in CVD systems which are distinguished based upon how the susceptor is heated: resistive heating schemes utilize a resistive heating element to directly heat the wafer and produce a reaction which is more localized at the wafer. Lamp heating schemes use a radiant heating lamp which heats the substrates susceptor and chamber and produces a reaction which is present throughout the chamber.

An exemplary CVD process which is useful for a variety of semiconductor applications is the dichlorosilane (DCS) tungsten silicide process. Because of the temperatures at which the DCS process occurs, resistive heating systems are not suitable for the process as they are not capable of sustaining the required process temperature range (500°–600° C.). As a result, the process is performed in, for example, a halogen lamp heated CVD chamber.

In a DCS tungsten silicide process, the tungsten silicide film is formed by a reaction of $WF_6$, DCS, and $SiH_4$. As with other CVD processes, after processing a series of wafers, typically twenty-five, the chamber is cleaned to remove products of the reaction which have deposited on the walls of the reaction chamber and other components inside the chamber. During the cleaning process, the susceptors remain in the CVD chamber.

Two different types of cleaning processes are generally utilized: chemical cleaning or plasma cleaning. Plasma cleaning involves generating a plasma using $NF_3$ and RF energy. As a result, plasma cleaning is more localized, but results in an uneven cleaning of the deposits since it is more difficult to control. If the plasma clean process is performed at temperatures in the 500°–600° C. range, the susceptor will be severely damaged and a great deal of particulate matter will be generated from the other components of the system. In addition, plasma cleanings are localized and less uniform. Chemical cleaning is more uniform, but is more stressful on the components of the chamber.

Chemical cleaning involves placing $ClF_3$ in the process chamber to produce a thermally dependant reaction which is more severe at higher temperatures Chemical cleaning can damage the susceptor if not properly controlled. Chemical cleaning in chlorine tetrafluoride ($ClF_3$) at temperatures of 300°–600° C. is undesirable as it can cause both mechanical and chemical stresses on susceptors. For example, when using a glass carbon susceptor, the chemical cleaning must be conducted at a temperature of 200° C. This requires cooling the process chamber from the 500°–600° C. DCS tungsten silicide processing temperature, thereby slowing the processing throughput of the chamber.

Susceptors formed of an underlying material, such as glass-carbon or graphite, with an AlN coating are particularly subject to such chemical and mechanical stresses. Because of thermal mismatches in the conventional materials currently utilized to form susceptors, thermal cycling stresses between the coating and the susceptor material will be such that cracks will form in the susceptor surface.

FIGS. 1A and 1B are a top and side view, respectively, of a conventional susceptor design representing the current state of the art.

Susceptor 10 includes a substrate mounting surface 12 upon which substrate which is to be processed is placed. Substrate mounting surface 12 of the susceptor 10 has an effective area which extends to an inner diameter 14 which is defined by the inner edge 16 of a plurality of holding posts 18 which are positioned on the perimeter of susceptor 10. Approximately eleven (11) holding posts 18 are provided on the perimeter of susceptor 10. Each post has an inside edge 16 which is beveled as shown in FIG. 1B. Each post also has two side edges 20,22 which are connected to the top surface 24 of susceptor 10. The edges which are formed by the inner section of edges 16, 20 and 22 with surface 24 represent stress points at which mechanical stress, generated by thermal cycling between the cleaning and process steps, can result in cracks in the AlN coating After cracks have developed, during the cleaning process, chemical cleaning agents infiltrate the substrate material and corrode the coating and susceptor material, thereby rendering the susceptor unusable for further processing.

As a result, the susceptor 10 of the prior art generally must be utilized in a chemical cleaning process wherein the temperature is maintained at a level of approximately 200° C.elsius or lower. This dramatically increases the processing time of the CVD process and results in lower throughput for the CVD system as a whole.

SUMMARY OF THE INVENTION

The invention, roughly described, comprises a susceptor with improved resistance to thermal cycling and chemical attack during processing, high temperature cleaning cycles, and corrosive CVD applications. The susceptor comprises a body of graphite material, the body having a top surface defining a substrate holding area. The top surface is surrounded by a lip, the lip having a beveled inner side, a top side, an outer side, a first rounded edge between the top side and the outer side, a second rounded edge between the top side and the inner side, and a third rounded edge between the inner side and the top surface. A coating comprising a certain thickness film of aluminum nitride covers the susceptor body. Prior to application of the aluminum nitride coating, the susceptor will be bead-blasted to improve coating adhesion. The graphite material comprising the body has a thermal coefficient closely matching the thermal coefficient of the AlN coating.

BRIEF DESCRIPTION OF THE DRAWINGS

The invention will be described with respect to the particular embodiments thereof. Other objects, features, and advantages of the invention will become apparent with reference to the specification and drawings in which:

FIG. 5 is a cross section along line C—C in FIG. 2.

FIG. 6 is a cross section along line B—B in FIG. 4.

FIG. 7 is a cross section along the line D—D in FIG. 2.

FIG. 8 is a cross section along line E—E in FIG. 4.

FIGS. 9A–9B are a top view and cross-sectional view of a thermocouple insert for the susceptor shown in FIG. 2.

FIG. 10 is a cross-section of a thermocouple insert for the susceptor shown in FIG. 2.

DETAILED DESCRIPTION OF THE PREFERRED EMBODIMENTS

FIGS. 2–8 show a susceptor in accordance with the present invention. The susceptor is advantageous in transporting substrates through a chemical vapor deposition (CVD) chamber and may be used with high temperature process and cleaning cycles, thereby reducing the processing time of the process as a whole. Preferably, the chamber is a dielectric or metalorganic chemical vapor deposition system although the principle of the invention will be useful in many different types of CVD systems.

Figure 2:
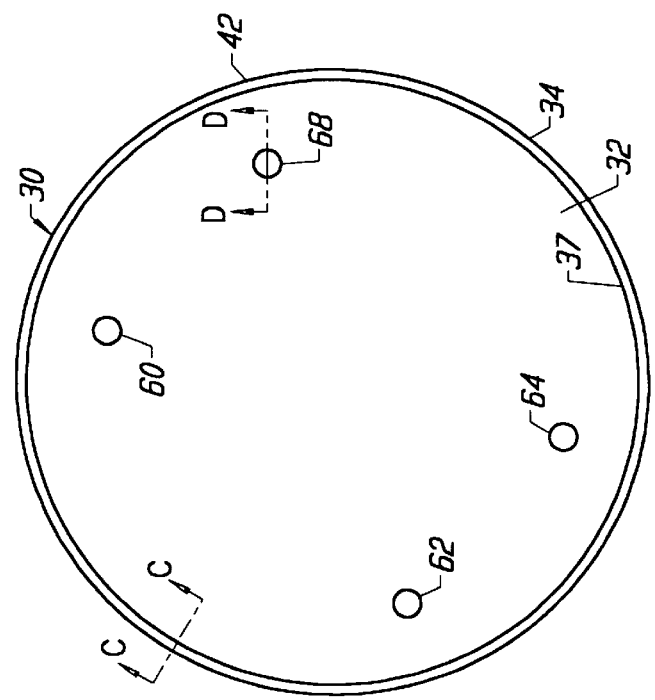
FIG. 2 is a top view of a susceptor for a chemical vapor deposition apparatus in accordance with the present invention

As shown in FIG. 2, a susceptor 30 includes a substrate holding surface 32 which comprises a planar surface of susceptor 30. In order to prevent lateral movement of the substrate while susceptor 30 is holding a substrate, a lip 34 is defined at the outside edge 42 of susceptor 30 and comprises the boundary of the substrate holding surface 32.

Lip 34 is shown in further detail in FIG. 5. The effective area of the substrate mounting surface 32 is defined by the base edge 37 of beveled side 36 of lip 34, as shown in FIG. 5. Base edge 37 defines an inner diameter of the susceptor 30, while side 42 defines an outer diameter. In one embodiment for holding a 200 mm. substrate, edge 37 defines a substrate mounting surface diameter of approximately 8". As shown in FIG. 5, the width W of the beveled side 36 between base edge 37 and top edge 39 is approximately 0.033", while the height H of top side 38 is approximately 0.031" above the substrate mounting surface 32.

Lip 34 has a rounded outer edge 40 between outer side 42 and top side 38. Top edge 39 and base edge 37 are rounded to a radius circle of approximately 0.015" and 0.010", respectively. This rounding provides for a reduced stress of the edges during thermal cycling. Outer edge 40, between outer side 42 and top side 38, is rounded to a radius circle of approximately 0.060". These mechanical features of the susceptor of the present invention greatly contribute to the reduction in the stress characteristics of the device.

It should be recognized that these dimensions are exemplary and, in alternative embodiments of the invention, will vary with respect to the size and shape of the susceptor. These values were determined empirically by trial and error to provide optimal resistance to thermal cycling stresses Also shown in FIG. 2 are additional bores 60, 62, 64, and 68. These bores are shown in cross-section in FIG. 7. These through bores allow substrate manipulation fingers to raise and lower a substrate onto the substrate mounting surface 32. Bore 68, which is exemplary of bores 60, 62, 64, and 68, has a width of approximately 0.38" with rounded edges 69 defined as a radius of 0.06", again contributing to the stress resistance of the susceptor during thermal cycling and chemical cleaning.

Figure 1B:
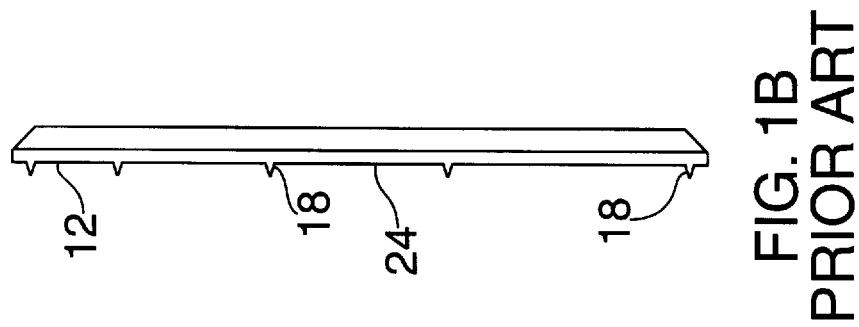
FIGS. 1A and 1B are a top view and side view, respectively, of a prior art susceptor for use in a chemical vapor deposition apparatus.
Figure 1A:
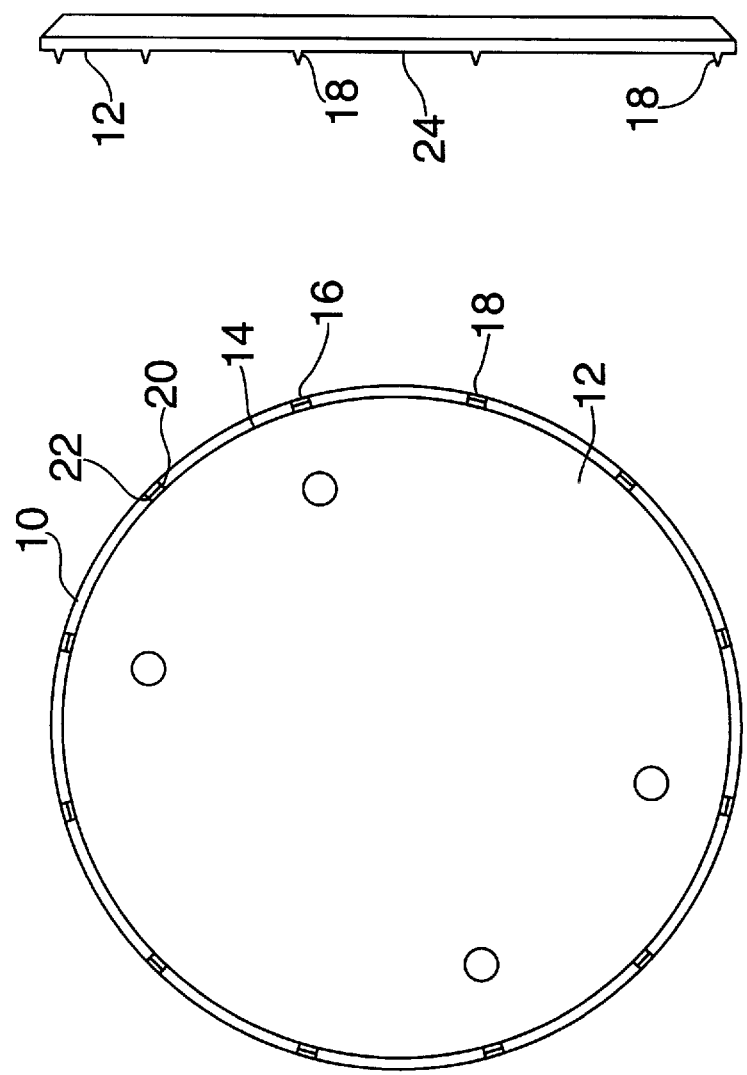
Figure 4:
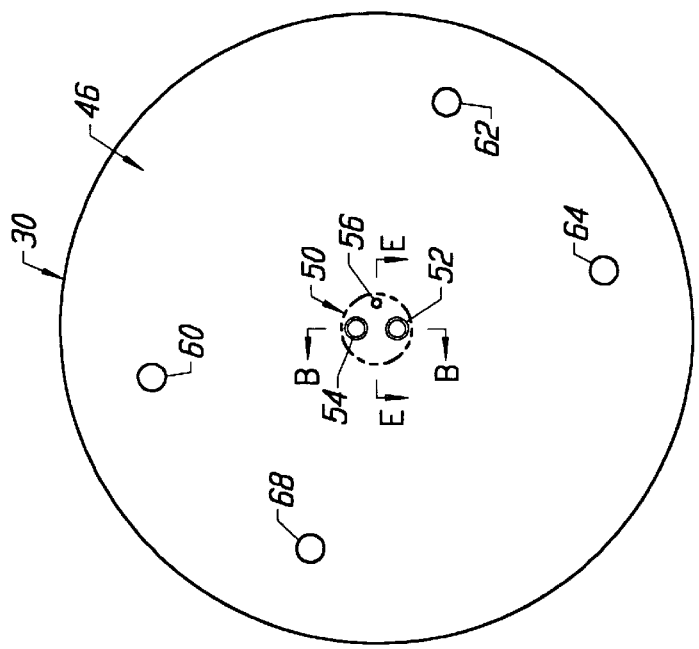
FIG. 4 is a bottom view of the susceptor shown in FIG. 2.
Figure 3:
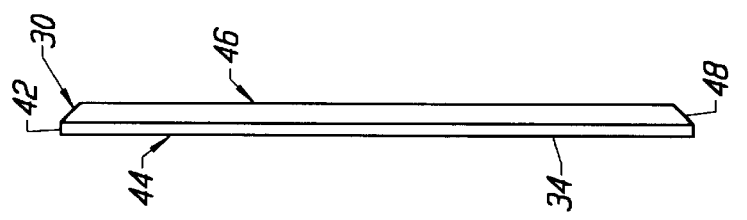
FIG. 3 is a side view of the susceptor shown in FIG. 2.

Susceptor 30 further includes a bottom surface 46 having a beveled edge 48. The bottom surface 46 of susceptor 30 is shown in FIG. 4. As shown therein, a non-coated area 50 is provided to allow for thermocouple inserts, and securing the susceptor to the CVD chamber. Susceptor 30 is formed from a graphite or a graphite composite material covered with an aluminum nitride coating. The aluminum nitride coating may preferably be in the range of 40–60 microns thick. In accordance with the present invention, the aluminum nitride coating is applied to the surface of susceptor 30 subsequent to a bead blasting operation. Traditionally, the surface of susceptor 30 is prepared for the application of aluminum nitride coating by applying a machined finish to the surface. The conventional thinking in the art is that a machined surface provides for better adhesion of the coating. However, it has been discovered that bead blasting surface, thereby providing a rougher surface finish, actually provides better adhesion for the coating. This allows for better bonding of the aluminum nitride coating to the graphite susceptor material. Other techniques for roughing the surface of the susceptor prior to application of the coating, such as sand blasting and grooving, or even machined processing to produce a greater surface roughness, are acceptable alternatives. As shown in FIG. 4, a portion of area 50 of the bottom surface 46 of susceptor 30 remains free of the aluminum nitride coating, and is to be selectively plated with a nickel sulfamate material subsequent to coating the susceptor with AlN.

FIG. 6 shows a cross-section of the susceptor mounting bores 52, 54 along line B—B in FIG. 4. These bores receive mounting inserts 50 for securing susceptor 30 on a susceptor arm which is mounted in a CVD chamber FIGS. 9A and 9B show a top view and cross-sectional view of the mounting inserts 150.

FIG. 8 shows a cross-section of bore 56 which is used with a thermocouple insert 160, shown in cross-section in FIG. 10, to connect a thermocouple of the CVD chamber to the susceptor 30.

The graphite material utilized to form susceptor 30 has a thermal expansion coefficient which closely matches the aluminum nitride coating. In prior art susceptor designs, the thermal expansion coefficient of the substrate material was approximately $7 \times 10^{-6}$. In the material of the present invention, the thermal expansion coefficient is approximately $5 \times 10^{-6}$. This material is commonly available for purchase from Xycarb Ceramics, Helmond, The Netherlands. It should be noted that the thickness of the aluminum nitride coating can be in a range of 40–60 microns.

The many features and advantages of the present invention will be apparent to one of average skill in the art. The invention provides a susceptor which has an improved resistance to mechanical heat and cleaning cycling and chemical vapor deposition chambers All such features and advantages of the present invention are intended to be within the scope of the invention as defined by the claims.

What is claimed is:

1. An apparatus, comprising:

a planar substrate mounting surface having an area;

a lip surrounding the substrate mounting surface and defining said area; having a height above the mounting surface and a first rounded edge between an inner edge and the planar surface, the lip further having a top side and an outer side, and a second rounded edge coupling the outer side to the top side.

2. The apparatus of claim 1 wherein the apparatus comprises a susceptor for a chemical vapor deposition chamber.

3. The apparatus of claim 1 wherein the second rounded edge is rounded to a radius circle of about 0.020–0.060 inch.

4. The apparatus of claim 1 wherein the first rounded edge is rounded to a radius circle of about 0.010 to 0.015 inch.

5. The apparatus of claim 1 wherein the apparatus further includes a third rounded edge between the top side and the inner edge, the third rounded edge being rounded to a radius circle of about 0.015 inch.

6. The apparatus of claim 1 wherein the apparatus is comprised of a graphite composite material having an aluminum nitride coating.

7. The apparatus of claim 6 wherein the material has a thermal expansion coefficient closely matched with the thermal expansion coefficient of aluminum nitride.

8. The apparatus of claim 7 wherein the graphite material is bead blasted prior to application of the aluminum nitride coating.

9. The apparatus of claim 8 wherein the coating thickness is about 40–60 microns.

10. A susceptor for a chemical vapor deposition chamber, comprising:
a wafer support surface having a recessed planar surface and a lip, the lip portion having a beveled inner side, a top side and an outer sides and further including a rounded base edge between the inner side and recessed planar surface.

11. The susceptor of claim 10 wherein the rounded base edge is rounded to a radius circle of about 0.010 to 0.015 inch.

12. The susceptor of claim 11 further including a second rounded edge between the outer side and the top side, wherein the second rounded edge is rounded to a radius circle of about 0.020 to 0.060 inch.

13. The susceptor of claim 12 further includes a third rounded edge between the top side and the inner side, the third rounded edge being rounded to a radius circle of about 0.015 inch.

14. The susceptor of claim 10 is comprised of a graphite composite material having an aluminum nitride coating.

15. The susceptor of claim 14 wherein the aluminum nitride coating thickness is about 40–60 micron.

16. The susceptor of claim 14 wherein the graphite material has a thermal expansion coefficient closely matched with the thermal expansion coefficient of aluminum nitride.

17. The susceptor of claim 14 wherein the graphite material is bead blasted prior to application of the aluminum nitride coating.

18. A susceptor for use in chemical vapor deposition, comprising:
a body comprised of graphite material, the body having a top surface defining a substrate holding area, the top surface surrounded by a lip, the lip having a beveled inner side, a top side, an outer side, a first rounded edge between the top side and the outer side, and a second rounded edge between the top side and the inner side, and a third rounded edge between the inner side and the top surface; and a coating covering the body, the coating comprising a film of aluminum nitride;

wherein the graphite material comprising the body has a thermal coefficient closely matching the thermal coefficient of the AlN coating.

19. The susceptor of claim 18 wherein the AlN coating has a thickness of 40–60 micron.

20. The susceptor of claim 18 wherein the first rounded edge has a radius of 0.020 to 0.060 inch.

21. The susceptor of claim 20 wherein the second rounded edge has a radius of 0.010 to 0.015 inch.

22. The susceptor of claim 21 wherein the third rounded edge has a radius of 0.010 to 0.015 inch.

* * * * *